(12) United States Patent
Feng et al.

(10) Patent No.: US 12,213,262 B2
(45) Date of Patent: Jan. 28, 2025

(54) FLEXIBLE SUPPORT, METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Binfeng Feng, Beijing (CN); Fei Li, Beijing (CN); Bowen Xiao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 343 days.

(21) Appl. No.: 17/535,964

(22) Filed: Nov. 26, 2021

(65) Prior Publication Data

US 2022/0312604 A1    Sep. 29, 2022

(30) Foreign Application Priority Data

Mar. 26, 2021  (CN) .......................... 202110326799.3

(51) Int. Cl.
*H10K 77/10*    (2023.01)
*B32B 3/26*    (2006.01)
(Continued)

(52) U.S. Cl.
CPC .............. *H05K 5/02* (2013.01); *B32B 3/266* (2013.01); *B32B 3/30* (2013.01); *B32B 7/12* (2013.01);
(Continued)

(58) Field of Classification Search
CPC ...... H05K 5/02; H05K 5/0017; H10K 77/111; H10K 2102/311; B32B 3/266; B32B 3/30;
(Continued)

(56) References Cited

U.S. PATENT DOCUMENTS 10,490,771 B2 * 11/2019  Kim ...................... H10K 50/844
11,581,500 B2 *  2/2023  Song ....................... G09F 9/301
(Continued)

FOREIGN PATENT DOCUMENTS

CN    110534020 A    12/2019
CN    110969939    *    4/2020    ............. G09F 9/301
(Continued)

OTHER PUBLICATIONS

CN202110326799.3 first office action.

*Primary Examiner* — Anthony Q Edwards
*Assistant Examiner* — Hung Q Dang
(74) *Attorney, Agent, or Firm* — IPro, PLLC

(57) ABSTRACT

Provided is a flexible support. The flexible support includes two first flexible support plates and one second flexible support plate. The second flexible support plate includes a first foldable region extending along a first direction, wherein the first foldable region includes a first side edge and a second side edge extending along the first direction; one of the two first flexible support plates is disposed on a side, distal from the second side edge, of the first side edge, the other of the two first flexible support plates is disposed on a side, distal from the first side edge of the second side edge, and the two first flexible support plates are respectively connected to two opposite side edges of the second flexible support plate. A material density of the first flexible support plate is less than a material density of the second flexible support plate.

16 Claims, 14 Drawing Sheets

(51) Int. Cl.
  *B32B 3/30* (2006.01)
  *B32B 7/12* (2006.01)
  *B32B 15/08* (2006.01)
  *B32B 15/09* (2006.01)
  *B32B 15/095* (2006.01)
  *B32B 15/18* (2006.01)
  *B32B 15/20* (2006.01)
  *B32B 27/28* (2006.01)
  *B32B 27/36* (2006.01)
  *B32B 27/40* (2006.01)
  *H05K 5/00* (2006.01)
  *H05K 5/02* (2006.01)
  *H10K 102/00* (2023.01)

(52) U.S. Cl.
  CPC .............. *B32B 15/08* (2013.01); *B32B 15/09* (2013.01); *B32B 15/095* (2013.01); *B32B 15/18* (2013.01); *B32B 15/20* (2013.01); *B32B 27/281* (2013.01); *B32B 27/36* (2013.01); *B32B 27/40* (2013.01); *H05K 5/0017* (2013.01); *B32B 2307/536* (2013.01); *B32B 2307/72* (2013.01); *B32B 2457/20* (2013.01); *H10K 77/111* (2023.02); *H10K 2102/311* (2023.02)

(58) Field of Classification Search
  CPC ........... B32B 7/12; B32B 15/08; B32B 15/09; B32B 15/095; B32B 15/18; B32B 15/20; B32B 27/281; B32B 27/36; B32B 27/40; B32B 2307/536; B32B 2307/72; B32B 2457/20; B32B 3/14; B32B 5/142; B32B 2307/546; B32B 27/08; Y02E 10/549; G09F 9/301
  See application file for complete search history.

(56) References Cited

U.S. PATENT DOCUMENTS

2018/0242466 A1\* 8/2018 Lee ..................... G06F 1/1652
2023/0111654 A1\* 4/2023 Li .......................... G09F 9/301
  361/807

FOREIGN PATENT DOCUMENTS

CN 110969939 A 4/2020
CN 210627727 U 5/2020
CN 112489564 A 3/2021

\* cited by examiner

A-A

B-B

FLEXIBLE SUPPORT, METHOD FOR MANUFACTURING SAME, AND DISPLAY DEVICE

CROSS-REFERENCE TO RELATED APPLICATION

The present application claims priority to Chinese Patent Application No. 202110326799.3, filed on Mar. 26, 2021 and entitled "FLEXIBLE SUPPORT, METHOD FOR MANUFACTURING SAME, AND DISPLAY DEVICE", the entire contents of which are incorporated herein by reference.

TECHNICAL FIELD

The present disclosure relates to the field of displays, and more particularly to a flexible support, a method for manufacturing the same, and a display device.

BACKGROUND

The emergence of foldable display devices such as foldable phones has urged rapid development of the foldable display technologies. The foldable display device includes a flexible support and a foldable display panel, and the flexible support is configured to support the foldable display panel to ensure an appearance morphology of the foldable display device.

SUMMARY

Embodiments of the present disclosure provide a flexible support, a method for manufacturing the same, and a display device, which reduce a weight of the flexible support.

In one aspect of the embodiments of the present disclosure, a flexible support is provided. The flexible support is configured to support a foldable display panel, and the flexible support includes two first flexible support plates and one second flexible support plate. The second flexible support plate includes a first foldable region extending along a first direction, wherein the first foldable region includes a first side edge and a second side edge extending along the first direction. One of the two first flexible support plates is disposed on a side, distal from the second side edge, of the first side edge, the other of the two first flexible support plates is disposed on a side, distal from the first side edge, of the second side edge, and the two first flexible support plates are respectively connected to two opposite side edges of the second flexible support plate. A material density of the first flexible support plate is less than a material density of the second flexible support plate.

In some embodiments, a side edge, connected to the second flexible support plate, of the first flexible support plate is provided with a first connection structure, and two opposite side edges, connected to the first flexible support plate, of the second flexible support plate are each provided with a second connection structure, wherein the first connection structure and the second connection structure are engaged with each other.

In some embodiments, the first connection structure includes a plurality of first connection protrusions arranged along the first direction, wherein a first gap is present between any adjacent two of the plurality of first connection protrusions, and a maximum width of the first connection protrusion is greater than a width of an end, distal from the second flexible support plate, of the first connection protrusion; and the second connection structure includes a plurality of second connection protrusions arranged along the first direction, wherein a second gap is present between any adjacent two of the plurality of second connection protrusions; wherein a shape of the second connection protrusion matches a shape of the first gap, and the second connection protrusion and the first gap are in one-to-one correspondence; a shape of the second gap matches a shape of the first connection protrusion, and the second gap and the first connection protrusion are in one-to-one correspondence; and the second connection protrusion is disposed within a corresponding first gap, and the first connection protrusion is disposed within a corresponding second gap.

In some embodiments, a ratio of the width to the maximum width ranges from $1/5$ to $1/2$; and a ratio of the maximum width to a length of the first connection protrusion ranges from $3/10$ to $1/2$.

In some embodiments, the shape of the first connection protrusion and the shape of the second connection protrusion are both one of a drop, a triangle, and a trapezoid.

In some embodiments, the second flexible support plate further includes a foldable plate and a connection plate; wherein the first foldable region is disposed on the foldable plate; and the connection plate is connected to the foldable plate and the second connection structure, and a ratio of a width of the connection plate to a length of the second connection protrusion ranges from $1/5$ to $1/3$.

In some embodiments, the flexible support further includes a third flexible support plate; wherein the two first flexible support plates are laminated on the third flexible support plate, the third flexible support plate and the two first flexible support plates form a groove structure, and the second flexible support plate is disposed within the groove structure.

In some embodiments, the flexible support further includes a first adhesive layer disposed between the third flexible support plate and the second flexible support plate.

In some embodiments, a surface, opposite to the foldable display panel, of the first flexible support plate is provided with a hardened layer.

In some embodiments, a side, distal from the second flexible support plate, of at least one of the first flexible support plates is provided with a first bending structure.

In some embodiments, the first flexible support plate is made of at least one of polymer clay, polyester resin, polyimide, flexible polyurethane; and the second flexible support plate is made of at least one of stainless steel, aluminum alloy, and titanium alloy.

In another aspect of the embodiments of the present disclosure, a method for manufacturing a flexible support is provided. The method includes: providing two first flexible support plates; providing a second flexible support plate, wherein the second flexible support plate includes a first foldable region extending along a first direction, the first foldable region including a first side edge and a second side edge extending along the first direction, a material density of the first flexible support plate being less than a material density of the second flexible support plate; connecting the two first flexible support plates to two opposite side edges of the second flexible support plate respectively, such that one of the two first flexible support plates is disposed on a side, distal from the second side edge, of the first side edge, and the other of the two first flexible support plates is disposed on a side, distal from the first side edge, of the second side edge.

In some embodiments, providing the first flexible support plate includes acquiring the first flexible support plate by forming a plurality of first connection protrusions arranged along the first direction on a side edge of the first flexible material plate, wherein a first gap is present between any adjacent two of the plurality of first connection protrusions, and a maximum width of the first connection protrusion is greater than a width of an end, distal from the second flexible support plate, of the first connection protrusion.

In some embodiments, providing the second flexible support plate includes acquiring the second flexible support plate by forming a plurality of second connection protrusions arranged along the first direction on two opposite side edges of the second flexible material plate respectively, wherein a second gap is present between any adjacent two of the plurality of second connection protrusions, a shape of the second connection protrusion matches a shape of the first gap, and the second connection protrusion and the first gap are in one-to-one correspondence, a shape of the second gap matching a shape of the first connection protrusion, the second gap and the first connection protrusion being in one-to-one correspondence.

In some embodiments, the method further includes: providing a third flexible support plate; attaching the two first flexible support plates to the third flexible support plate such that the third flexible support plate and the two first flexible support plates form a groove structure; and disposing the second flexible support plate within the groove structure.

In still another aspect of the embodiments of the present disclosure, a display device is provided. The display device includes a flexible support and a foldable display panel that are laminated; wherein the flexible support includes two first flexible support plates and one second flexible support plate; wherein the second flexible support plate includes a first foldable region extending along a first direction, the first foldable region including a first side edge and a second side edge extending along the first direction; and one of the two first flexible support plates is disposed on a side, distal from the second side edge, of the first side edge, the other of the two first flexible support plates is disposed on a side, distal from the first side edge, of the second side edge; wherein the two first flexible support plates are respectively connected to two opposite side edges of the second flexible support plate; and a material density of the first flexible support plate is less than a material density of the second flexible support plate.

In some embodiments, a side edge, connected to the second flexible support plate, of the first flexible support plate is provided with a first connection structure, and two opposite side edges, connected to the first flexible support plate, of the second flexible support plate are each provided with a second connection structure, the first connection structure and the second connection structure being engaged with each other.

In some embodiments, the first connection structure includes a plurality of first connection protrusions arranged along the first direction, wherein a first gap is present between any adjacent two of the plurality of first connection protrusions, and a maximum width of the first connection protrusion is greater than a width of an end, distal from the second flexible support plate, of the first connection protrusion; and the second connection structure includes a plurality of second connection protrusions arranged along the first direction, wherein a second gap is present between any adjacent two of the plurality of second connection protrusions; wherein a shape of the second connection protrusion matches a shape of the first gap, and the second connection protrusion and the first gap are in one-to-one correspondence; a shape of the second gap matches a shape of the first connection protrusion, and the second gap and the first connection protrusion are in one-to-one correspondence; and the second connection protrusion is disposed within a corresponding first gap, and the first connection protrusion is disposed within a corresponding second gap.

In some embodiments, a ratio of the width to the maximum width ranges from $1/3$ to $1/2$; and a ratio of the maximum width to a length of the first connection protrusion ranges from $3/10$ to $1/2$.

DETAILED DESCRIPTION

For clearer descriptions of the objectives, technical solutions, and advantages of the present disclosure, the embodiments of the present disclosure are described clearly hereinafter in combination with the accompanying drawings.

In the related art, a flexible support is implemented with a flexible support plate, but a density of a material of the support plate is large, which causes a heavier weight of the folded display device and is detrimental to lightweight design of the folded display device.

Figure 1:
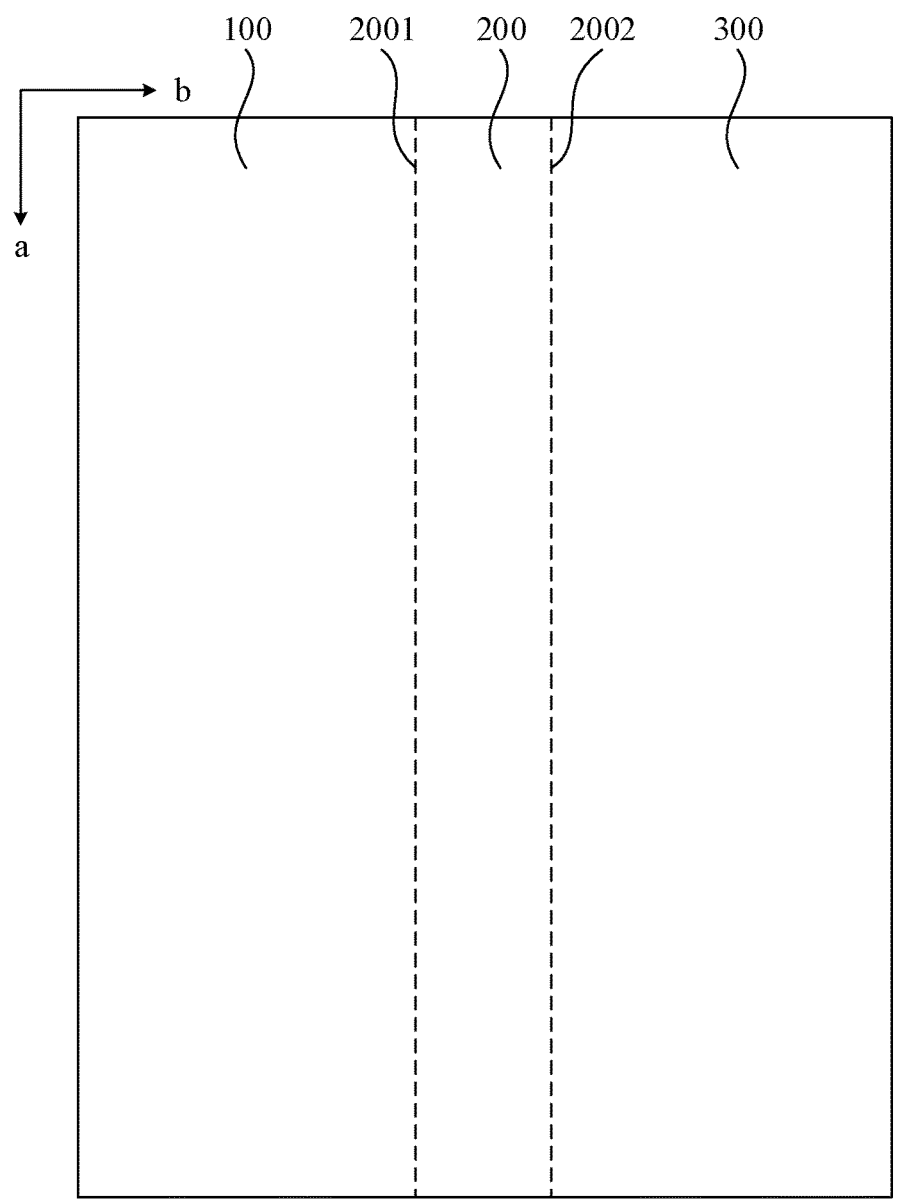
FIG. 1 is a top view of a foldable display panel according to an embodiment of the present disclosure.

FIG. 1 is a top view of a foldable display panel according to an embodiment of the present disclosure. Referring to FIG. 1, the foldable display panel includes a first flat display region 100, a foldable display region 200, and a second flat display region 300 that are connected in sequence. The foldable display region 200 is provided with a third side edge 2001 and a fourth side edge 2002 extending along a first direction a. In the case that the foldable display panel is unfolded, a surface of the first flat display region 100, a surface of the foldable display region 200, and a surface of the second flat display region 300 are all on a same plane. In this case, a display surface of the foldable display panel is maximum, thereby achieving a good display effect for the user.

Figure 2:
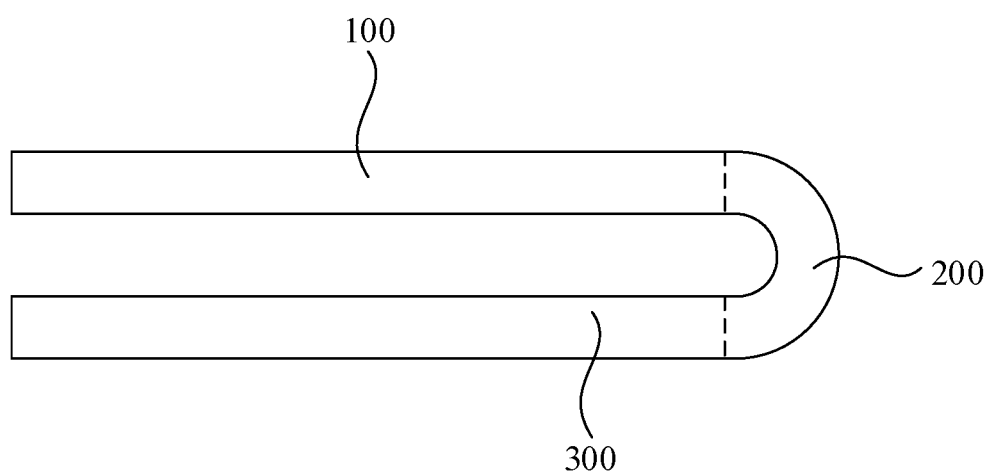
FIG. 2 is a side view of a foldable display panel when folded according to an embodiment of the present disclosure.

FIG. 2 is a side view of a foldable display panel when folded according to an embodiment of the present disclosure. Referring to FIG. 2, in the case that the foldable display panel is folded at the foldable display region 200, the second flat display region 300 is disposed on a back side of the first flat display region 100, and a maximum plane dimension of the foldable display panel becomes smaller such that the foldable display panel is more portable.

An embodiment of the present disclosure provides a flexible support configured to support a foldable display panel, wherein the flexible support can fold and unfold with the foldable display panel.

Figure 3:
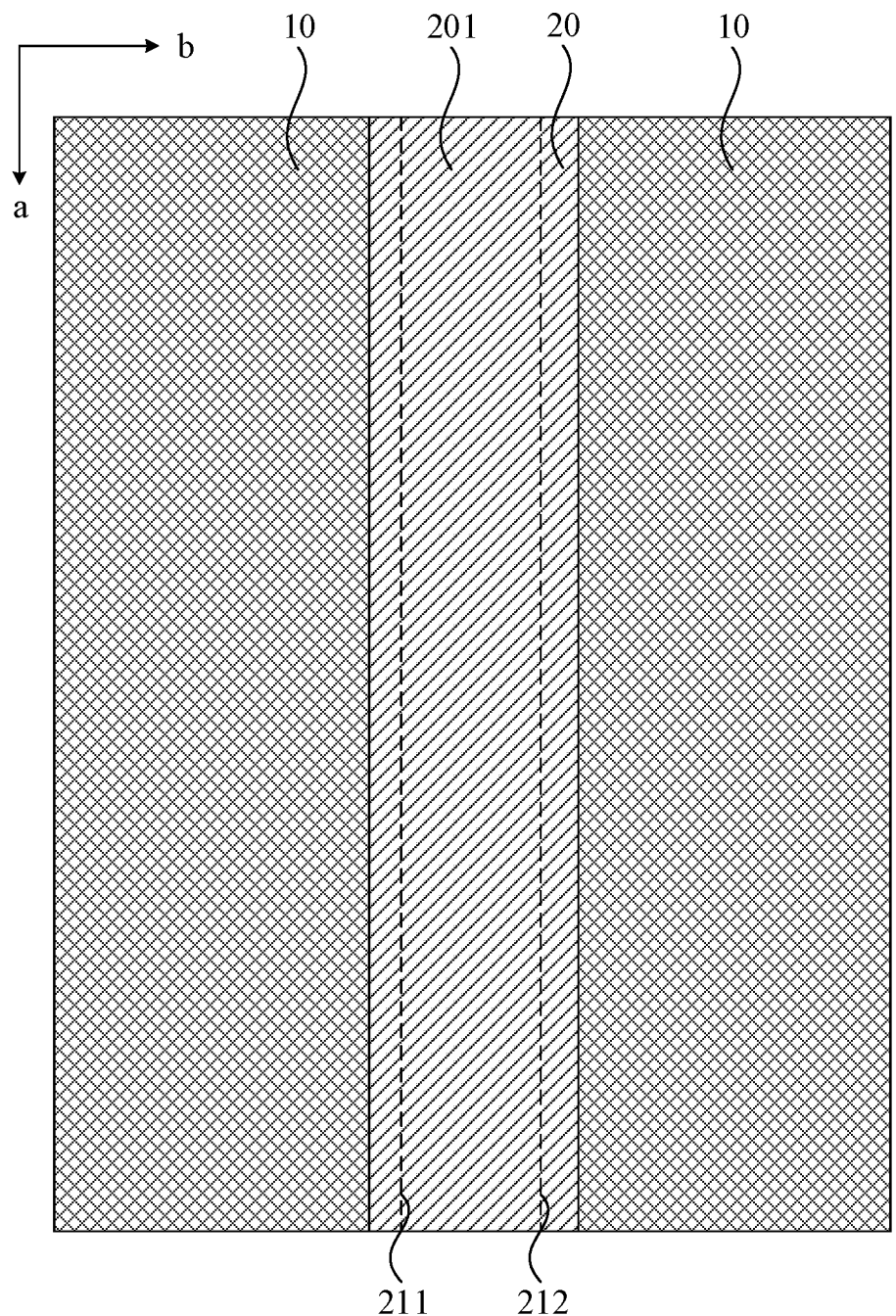
FIG. 3 is a top view of a flexible support according to an embodiment of the present disclosure.

FIG. 3 is a top view of a flexible support according to an embodiment of the present disclosure. Referring to FIG. 3, the flexible support includes two first flexible support plates 10 and one second flexible support plate 20. The second flexible support plate 20 includes a first foldable region 201 extending along the first direction a, and the first foldable region 201 includes a first side edge 211 and a second side edge 212 extending along the first direction. One of the two first flexible support plates 10 is disposed on a side, distal from the second side edge 212, of the first side edge 211, the other of the two first flexible support plates 10 is disposed on a side, distal from the first side edge 211, of the second side edge 212, and the two first flexible support plates 10 are respectively connected to two opposite side edges of the second flexible support plate 20. In the case that the foldable display panel is unfolded, a boundary of an orthogonal projection of the first foldable region 201 onto a first surface covers a boundary of the display region 200. That is, an orthogonal projection of the first side edge 211 onto the first surface covers the third side edge 2001, and an orthogonal projection of the second side edge 212 onto the first surface covers the fourth side edge 2002. The first surface is a surface of the foldable display panel in the case that the foldable display panel is unfolded. The first direction a is perpendicular to a second direction b, and the second direction b is an arrangement direction of the first flexible support plate 10 and the second flexible support plate 20. A material density of the first flexible support plate 10 is less than a material density of the second flexible support plate 20.

In some embodiments, the flexible support includes the first flexible support plate 10 and the second flexible support plate 20, and the first flexible support plate 10 and the second flexible support plate 20 support the foldable display panel. The second flexible support plate 20 is provided with the first foldable region 201 that ensures a foldable performance of the flexible support. In the related art, in the case that a material of the flexible support is the same as a material of the second flexible support plate, the flexible support is a whole second flexible support plate. In some embodiments, since the material density of the first flexible support plate is less than the material density of the second flexible support plate, the weight of the flexible support is reduced, thereby facilitating lightweight design of the foldable display device.

In some embodiments, the first flexible support plate 10 is a polymer clay (PC) plate, and a density of the polymer clay is small such that the weight of the first flexible support plate 10 may be reduced. Polymer clay is inexpensive and may reduce costs. Due to poor light reflectivity of the polymer, the reflection of the flexible support is weak in the case of taking photo, the photo is clear, and the errors are reduced. The elasticity of the polymer clay is great, and the residual stress is small during cutting, thereby reducing the likelihood that the flexible support is damaged during cutting.

In some embodiments, the first flexible support plate 10 may be made of one of polyester resin, polyimide, and flexible polyurethane, or the first flexible support plate 10 is made of at least two of polymer clay, polyester resin, polyimide, or flexible polyurethane.

In some embodiments, the second flexible support plate 20 is made of stainless steel, the support of stainless steel is great, which ensures support of the second flexible support plate 20. And a stainless steel plate is foldable to ensure the foldable performance of the second flexible support plate 20.

In some embodiments, the second flexible support plate 20 may be made of aluminum alloy or titanium alloy, or the second flexible support plate 20 is made of at least two of stainless steel, aluminum alloy, or titanium alloy.

In some embodiments, the material of the first flexible support plate 10 and the material of the second flexible support plate 20 may be selected as desired. For example, the first flexible support plate 10 is a polyester resin support plate and the second flexible support plate 20 is a titanium alloy plate.

Figure 4:
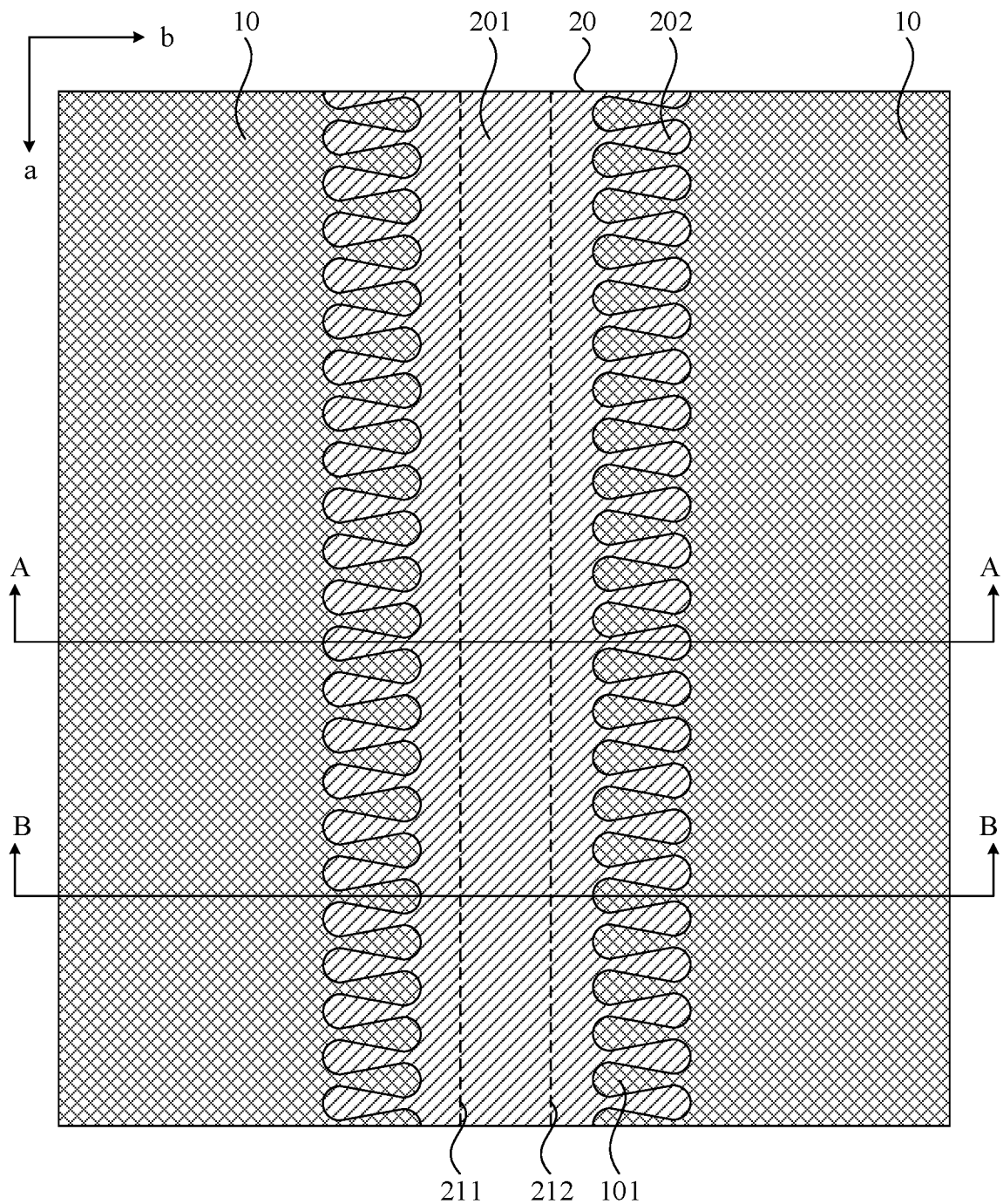
FIG. 4 is a top view of another flexible support according to an embodiment of the present disclosure.

FIG. 4 is a top view of another flexible support according to an embodiment of the present disclosure. Referring to FIG. 4, a side edge, connected to the second flexible support plate 20, of the first flexible support plate 10 is provided with a first connection structure 101, two opposite side edges, connected to the first flexible support plate 10, of the second flexible support plate 20 are each provided with a second connection structure 202, and the first connection structure 101 and the second connection structure 202 are engaged with each other.

In some embodiments, the first connection structure 101 and the second connection structure 202 are disposed to facilitate connection between the first flexible support plate 10 and the second flexible support plate 20 and ensure an integrity of the flexible support.

In some embodiments, the side edge of the first flexible support plate 10 and the side edge of the second flexible support plate 20 may be bonded together by a foam adhesive, such that the first flexible support plate 10 and the second flexible support plate 20 are connected together and hence the integrity of the flexible support is ensured.

Figure 5:
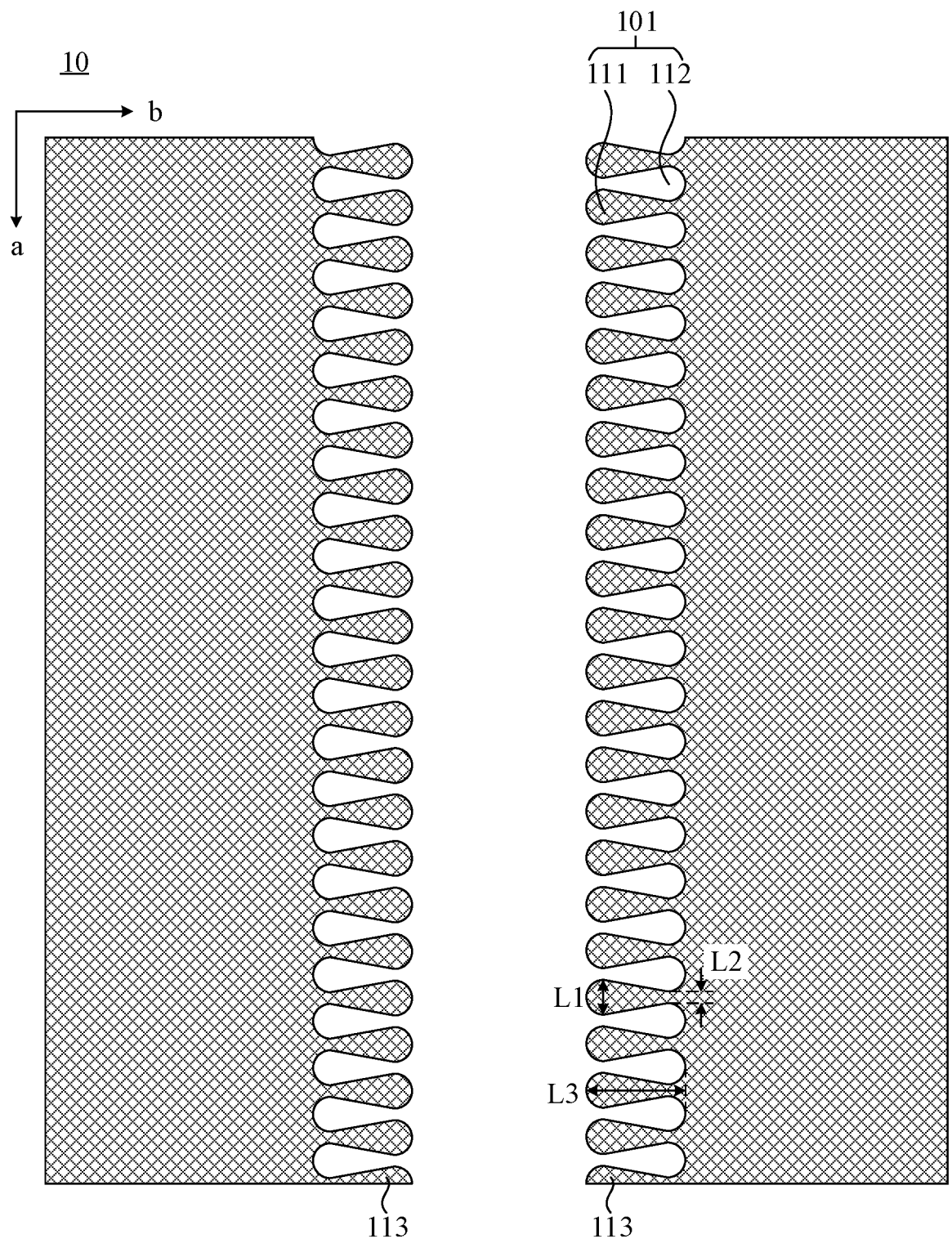
FIG. 5 is a top view of a first flexible support plate according to an embodiment of the present disclosure.

FIG. 5 is a top view of a first flexible support plate according to an embodiment of the present disclosure. Referring to FIG. 5, the first connection structure 101 includes a plurality of first connection protrusions 111 arranged along the first direction. A first gap 112 is present between any adjacent two of the plurality of first connection protrusions 111, and a maximum width L1 of the first connection protrusion 111 is greater than a width L2 of an end, distal from the second flexible support plate 20, of the first connection protrusion 111. The maximum width L1 of the first connection protrusion 111 refers to a maximum spacing between the side edges of the first connection protrusion 111 along the first direction a.

Figure 6:
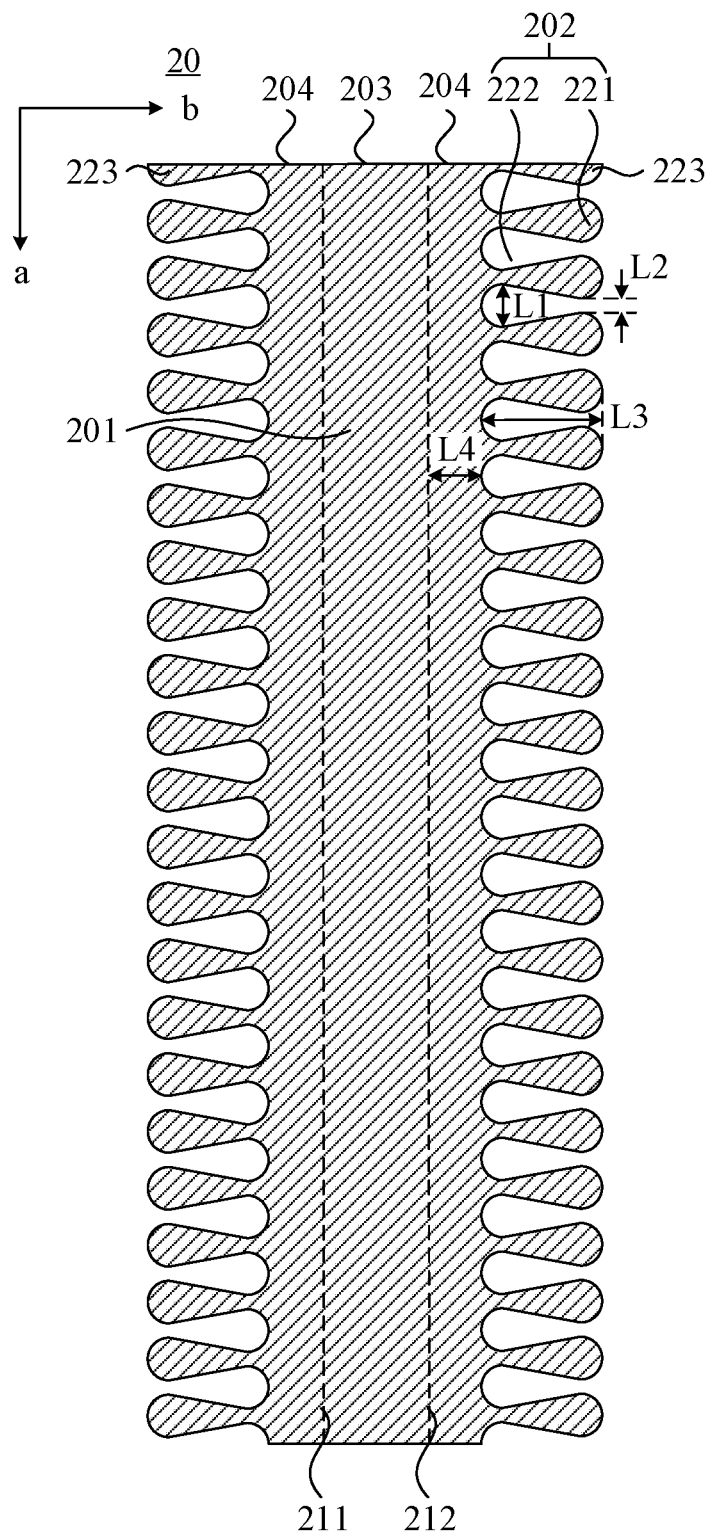
FIG. 6 is a top view of a second flexible support plate according to an embodiment of the present disclosure.

FIG. 6 is a top view of a second flexible support plate according to an embodiment of the present disclosure. Referring to FIG. 6, the second connection structure 202 includes a plurality of second connection protrusions 221 arranged along the first direction a. A second gap 222 is present between any adjacent two of the plurality of second connection protrusions 221.

In connection with FIG. 4 to FIG. 6, a shape of the second connection protrusion 221 matches a shape of the first gap 112, and the protrusion and the gap are in one-to-one correspondence, and a shape of the second gap 222 matches a shape of the first connection protrusion 111 and the gap and the protrusion are in one-to-one correspondence. The second connection protrusion 221 is disposed within the first gap 112, and the first connection protrusion 111 is disposed within the second gap 222.

In some embodiments, the first connection structure 101 and the second connection structure 202 are both designed to a form of a connected protrusion, the second connection protrusion 221 is disposed within the first gap 112, and the first connection protrusion 111 is disposed within the second gap 222. The first connection structure 101 and the second connection structure 202 are connected to form a connection buckle, and the first connection structure 101 and the second connection structure 202 are engaged with each other. In the folding process, a pulling force is present between the first connection protrusion 111 and the second connection protrusion 221, and the maximum width L1 of the first connection protrusion 111 is greater than the width L2 of the end, distal from the second flexible support plate 20, of the first connection protrusion 111, such that along the second direction b, the pulling force is insufficient to separate the first flexible support plate 10 from the second flexible support plate 20. In this way, the flexible support still functions as a support during the folding process and the portions are still securely engaged with each other.

The configuration that the shape of the second connection protrusion 221 matches the shape of the first gap 112 indicates that the shape of the second connection protrusion 221 is the same as the shape of the first gap 112, and the difference in dimension is within a range such that the second connection protrusion 221 can be disposed within the first gap 112, and the maximum width of the second connection protrusion 221 is greater than the width of the end, distal from the first flexible support plate 10, of the second connection protrusion 221. The configuration that the shape of the second gap 222 matches the shape of the first connection protrusion 111 indicates that the shape of the second gap 222 is the same as the shape of the first connection protrusion 111 and the difference in dimension is within a range such that the first connection protrusion 111 can be disposed within the second gap 222.

In some embodiments, a ratio of the width L2 to the maximum width L1 ranges from ⅓ to ½.

In some embodiments, in the case that the ratio of the maximum width L1 to the width L2 is defined and the maximum width L1 is determined, the width L2 is prevented from being excessively small to ensure the strength of the first connection protrusion 111, and the width L2 is not excessively great to prevent the strength of the engaging between the first connection structure 101 and the second connection structure 202 from being insufficient and prevent the first flexible support plate 10 and the second flexible support plate 20 from being disengaged in the folding process.

For example, the ratio of the width L2 to the maximum width L1 is ⅓.

In some embodiments, the ratio of the width L2 to the maximum width L1 may be other values.

For example, the maximum width L1 is 0.2 mm and the width L2 is 0.08 mm.

In some embodiments, a ratio of the maximum width L1 to a length L3 of the first connection protrusion 111 ranges from ³⁄₁₀ to ½. The length L3 of the first connection protrusion 111 refers to a spacing between an end, distal from the second flexible support plate 20, of the first connection protrusion 111 and an end, proximal to the second flexible support plate 20, of the first connection protrusion 111 along the second direction b.

In some embodiments, where the maximum width L1 of the first connection protrusion 111 is determined, the length L3 of the first connection protrusion 111 is greater, and the first connection protrusion 111 is damaged more easily. The ratio of the maximum width L1 to the length L3 of the first connection protrusion 111 is defined to avoid insufficient strength of the first connection protrusion 111 caused by excessively great length L3 of the first connection protrusion 111, and avoid a decreased area between the first connection structure 101 and the second connection structure 202 and excessively small engagement strength caused by excessive small length L3 of the first connection protrusion 111.

For example, the ratio of the maximum width L1 to the length L3 of the first connection protrusion 111 is ⅖.

In some embodiments, the ratio of the maximum width L1 to the length L3 of the first connection protrusion 111 may be other values.

For example, the maximum width L1 is 0.8 mm, and the length L3 of the first connection protrusion 111 is 2 mm.

In some embodiments, the shape of the first connection protrusion 111, the shape of the first gap 112, the shape of the second connection protrusion 221, and the shape of the second gap 222 are the same. The dimension of the first connection protrusion 111, the dimension of the first gap 112, the dimension of the second connection protrusion 221, and the dimension of the second gap 222 are all equal.

For example, the maximum width of the first connection protrusion 111, the maximum width of the first gap 112, the maximum width of the second connection protrusion 221, and the maximum width of the second gap 222 are all equal, and the length of the first connection protrusion 111, the length of the first gap 112, the length of the second connection protrusion 221, and the length of the second gap 222 are all equal. The width of an end, distal from the second flexible support plate 20, of the first connection protrusion 111, the width of an end, proximal to the second flexible support plate 20, of the first gap 112, the width of an end, distal from the first flexible support plate 10, of the second connection protrusion 221, and the width of an end, proximal to the first flexible support plate 10, of the second gap 222 are all equal.

Referring to FIG. 4 to FIG. 6, the shape of the first connection protrusion 111 and the shape of the second connection protrusion 221 are both a drop. The boundary of the drop is gradual to avoid the phenomenon of stress concentrations.

In some embodiments, the shape of the first connection protrusion 111 and the shape of the second connection protrusion 221 may further be a triangle, a trapezoid, and the like. It should be noted that the drop, the triangle, the trapezoid, or other shapes according to the embodiments are not necessarily the drop, the triangle, the trapezoid in a strict geometric sense. For example, the drop, the triangle, the trapezoid may include a chamfer, an arc angle, an arcuate side, and the like.

As shown in FIG. 5, the first connection structure 101 may further include a third connection protrusion 113 disposed at the lowermost, wherein the third connection protrusion 113 is in an incomplete drop shape.

In some embodiments, the first connection structure 101 may not include the third connection protrusion 113, or merely include the third connection protrusion 113 disposed at the uppermost of the first connection structure 101, or include the third connection protrusion 113 disposed at both the uppermost and the lowermost of the first connection structure 101.

In the case that the shape of the first connection protrusion 111 is a triangle, the third connection protrusion 113 may be in an incomplete triangle shape, and in the case that the shape of the first connection protrusion 111 is a trapezoid, the third connection protrusion 113 may be in an incomplete trapezoid shape.

As shown in FIG. 6, the second connection structure 202 may further include a fourth connection protrusion 223 disposed at the uppermost, wherein the fourth connection protrusion 223 is in an incomplete drop shape.

In some embodiments, the second connection structure 202 may not include the fourth connection protrusion 223, or merely include the fourth connection protrusion 223 disposed at the lowermost of the second connection structure 202, or include the fourth connection protrusion 223 disposed at both the uppermost and the lowermost of the second connection structure 202.

In the case that the shape of the second connection structure 202 is a triangle, the fourth connection protrusion 223 may be in an incomplete triangle shape, and in the case that the shape of the second connection structure 202 is a trapezoid, the fourth connection protrusion 223 may be in an incomplete trapezoid shape.

Referring to FIG. 6, the second flexible support plate 20 further includes a foldable plate 203 and a connection plate 204. The first foldable region 201 is disposed on the foldable plate 203, the connection plate 204 is connected to the foldable plate 203 and the second connection structure 202, and a ratio of a width L4 of the connection plate 204 to the length L3 of the second connection protrusion 221 ranges from ⅕ to ⅓.

In some embodiments, since the second gap 222 is present between adjacent second connection protrusions 221, in the case that the second connection protrusion 221 is directly connected to the foldable plate 203, the edge of the foldable plate 203 is floated at the second gap 222. In the folding process of the flexible support, the floated edge of the foldable plate 203 may tilt. The connection plate 204 is connected to the second connection structure 202 and the foldable plate 203 to cushion and prevent the foldable plate 203 from tilting in the folding process.

For example, the ratio of the width L4 of the connection plate 204 to the length L3 of the second connection protrusion 221 is ¼.

In some embodiments, the ratio of the ratio of the width L4 of the connection plate 204 to the length L3 of the second connection protrusion 221 may be other values.

For example, the length L3 of the first connection protrusion 111 is 2 mm, and the width L4 of the connection plate 204 is 0.5 mm.

Figure 7:
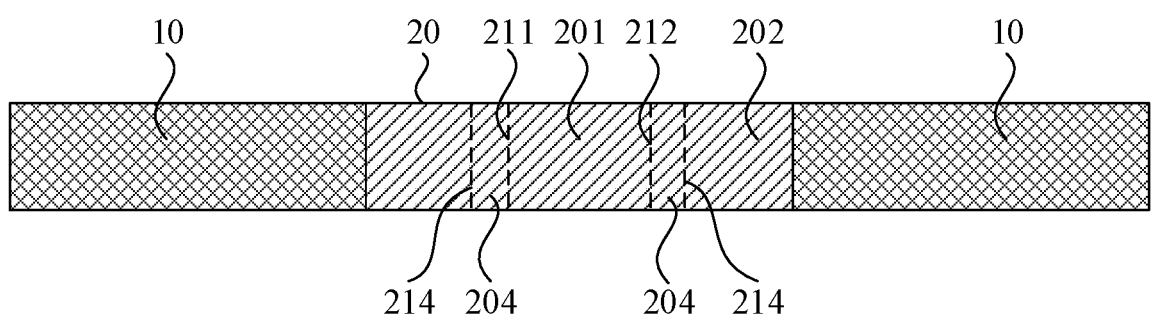
FIG. 7 is a cross-sectional view of a plane A-A in FIG. 4.

FIG. 7 is a cross-sectional view of a plane A-A in FIG. 4. Referring to FIG. 7, the second connection structure 202 may be seen in the cross-sectional view, and the first connection structure 101 may not be seen at the tangent of the cross-sectional view. Two first dashed lines 214 form the boundary line of an end, proximal to the second flexible support plate 20, of the first connection protrusion 111, the structure between one first dashed line 214 and the first side 211 is the connection plate 204, and the structure between the other first dashed line 214 and the second side 212 is the connection plate 204.

Figure 8:
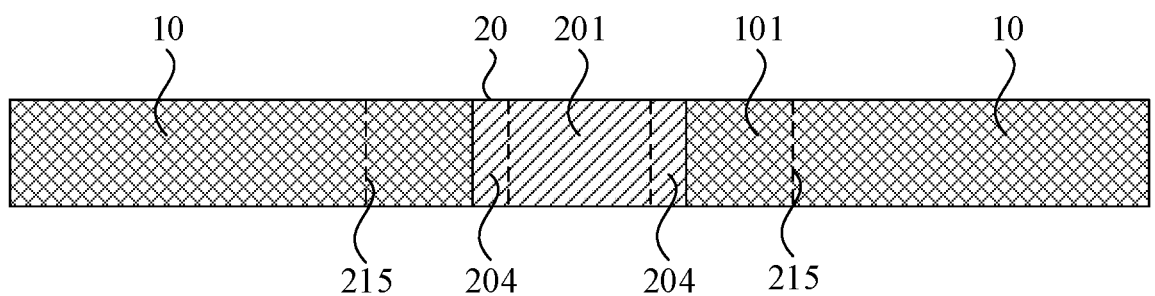
FIG. 8 is a cross-sectional view of a plane B-B in FIG. 4.

FIG. 8 is a cross-sectional view of a plane B-B in FIG. 4. Referring to FIG. 8, the first connection structure 101 may be seen in the cross-sectional view, the second connection structure 202 may not be seen at the tangent of the cross-sectional view, and the connection plate 204 is adjacent to the second connection structure 202. Two second dashed lines 215 in the first flexible support plate 10 form the boundary line of an end, proximal to the first flexible support plate 10, of the second connection protrusion 221.

In combination with FIG. 7 and FIG. 8, in the cross-sectional view, an orthogonal projection of the first connection structure 101 covers an orthogonal projection of the second connection structure 202.

Figure 9:
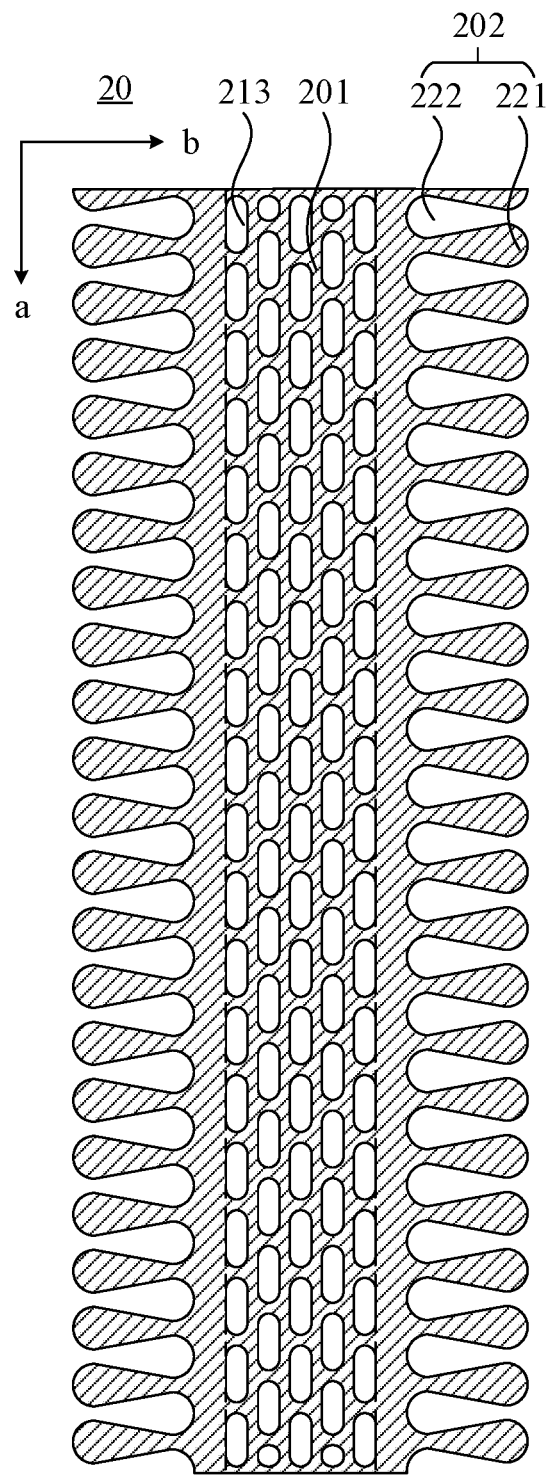
FIG. 9 is a top view of another second flexible support plate according to an embodiment of the present disclosure.

FIG. 9 is a top view of another second flexible support plate according to an embodiment of the present disclosure. Referring to FIG. 9, the second flexible support plate 20 includes a hollow 213 in the first foldable region 201.

In some embodiments, the second flexible support plate 20 is generally a metal plate, and the hollow 213 is arranged in the first foldable region 201 of the second flexible support plate 20 to increase the foldable performance of the second flexible support plate 20.

As shown in FIG. 9, the hollow 213 is a waist-shaped hole, wherein the boundary of the waist-shaped hole transitions smoothly to reduce stress concentrations in the folding process.

In some embodiments, the hollow 213 may be in other shapes, such as a circular hole or an elliptical hole.

Figure 10:
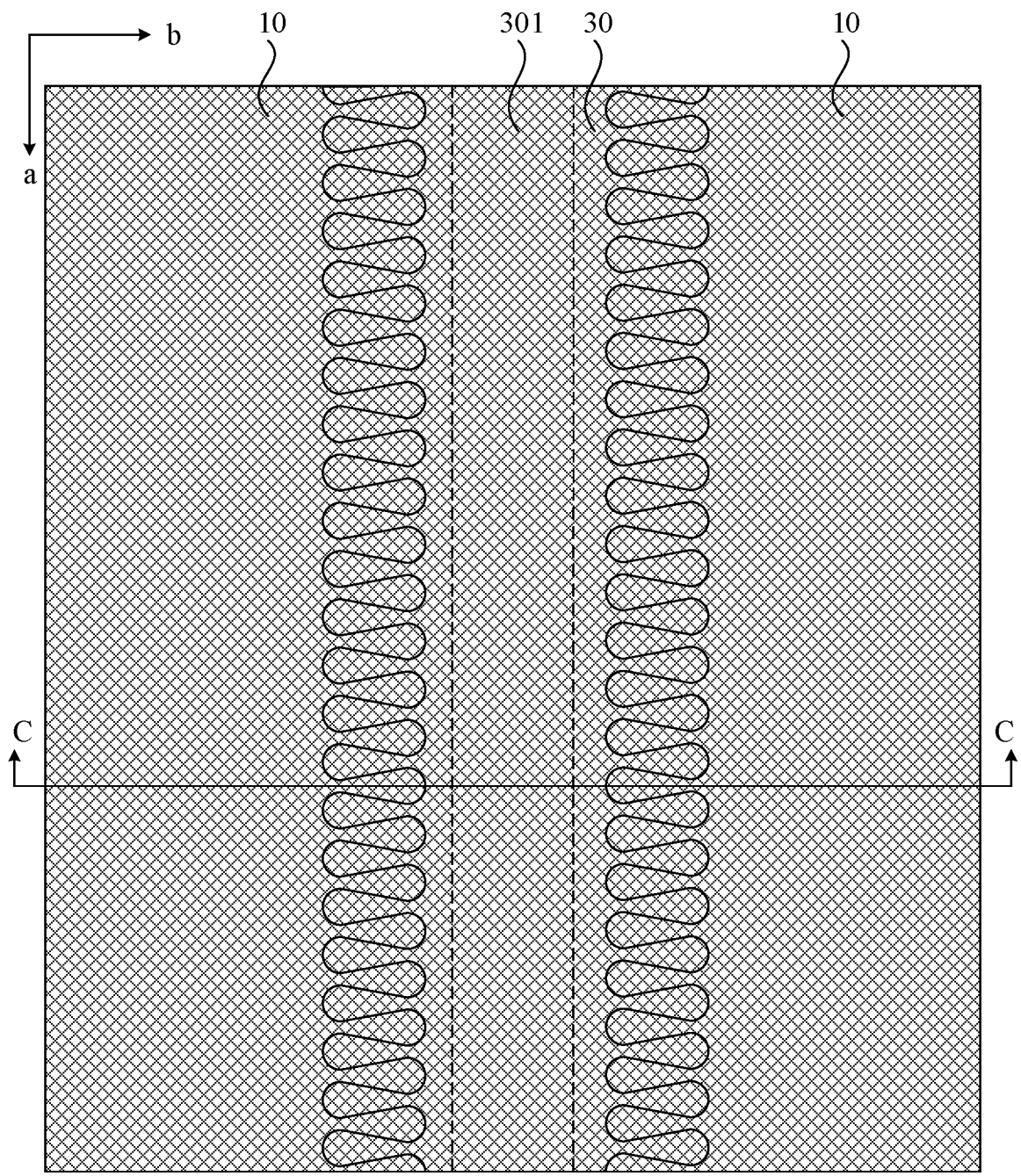
FIG. 10 is a top view of disposing a third flexible support plate and a first flexible support plate according to an embodiment of the present disclosure.

FIG. 10 is a top view of disposing a third flexible support plate and a first flexible support plate according to an embodiment of the present disclosure. Referring to FIG. 10, the flexible support further includes the third flexible support plate 30. In FIG. 10, the second flexible support plate 20 is not shown for clarity of the third flexible support plate 30.

Figure 11:
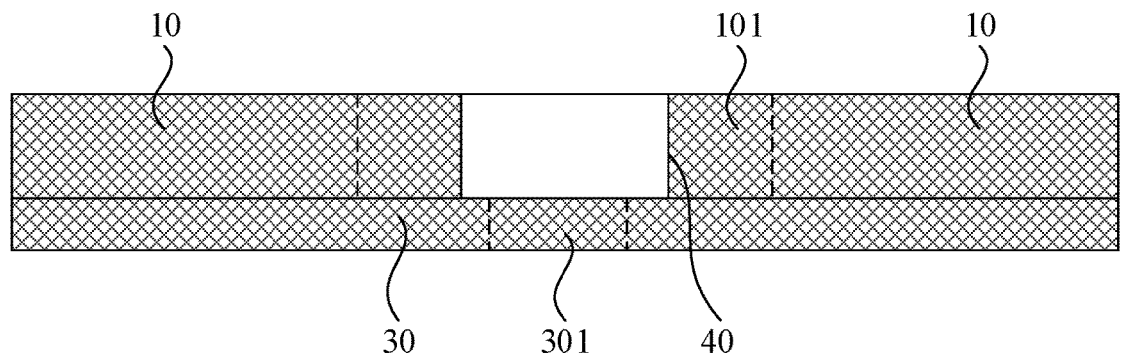
FIG. 11 is a cross-sectional view of a plane C-C in FIG. 10.

FIG. 11 is a cross-sectional view of a plane C-C in FIG. 10. Referring to FIG. 10, both of the two first flexible support plates 10 are laminated on the third flexible support plate 30, the third flexible support plate 30 and the two first flexible support plates 10 form a groove structure 40, and the second flexible support plate 20 (not shown in FIG. 11) is disposed within the groove structure 40.

In some embodiments, the third flexible support plate 30 is provided with a second foldable region 301, wherein an orthogonal projection of the second foldable region 301 onto the first surface covers the orthogonal projection of the first foldable region 201 onto the first surface.

In some embodiments, in the case that both of the first flexible support plates 10 are laminated on the third flexible support plate 30, the third flexible support plate and the two first flexible support plates 1030 form the groove structure 40, and the groove structure 40 is configured to accommodate the second flexible support plate 20. The bottom surface of the groove structure 40 supports the second flexible support plate 20 to improve the support of the second flexible support plate 20 for the foldable display panel.

In some embodiments, the first foldable region 201 corresponds to the second foldable region 301 to ensure the foldable performance of the flexible support.

In some embodiments, a material density of the third flexible support plate 30 is less than a material density of the second flexible support plate 20, which may reduce the weight of the flexible support.

In some embodiments, the third flexible support plate 30 is a polymer clay plate, wherein the density of the polymer clay is small, which may reduce the weight of the third flexible support plate 30.

In some embodiments, the third flexible support plate 30 is made of one of polyester resin, polyimide, and flexible polyurethane, or the third flexible support plate 30 is made of at least two of polymer clay, polyester resin, polyimide, or flexible polyurethane.

In some embodiments, the third flexible support plate 30 and the first flexible support plate 10 may be bonded together by a foam adhesive or a mesh adhesive.

In some embodiments, the third flexible support plate 30 and the first flexible support plate 10 may be integrally formed.

Figure 12:
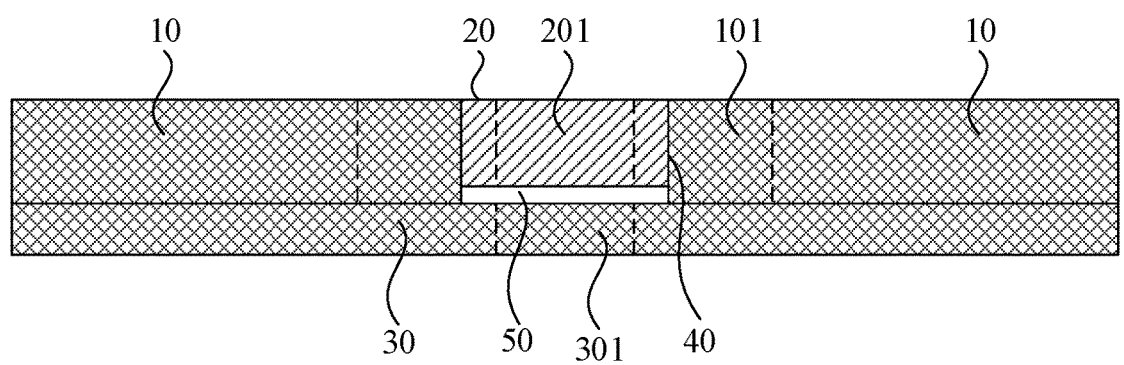
FIG. 12 is a side view of a flexible support according to an embodiment of the present disclosure.

FIG. 12 is a side view of a flexible support according to an embodiment of the present disclosure. Referring to FIG. 12, the flexible support further includes a first adhesive layer 50, wherein the first adhesive layer 50 is disposed between the third flexible support plate 30 and the second flexible support plate 20.

In some embodiments, the first adhesive layer 50 is configured to bond the third flexible support plate 30 and the second flexible support plate 20, and the second flexible support plate 20 is fixed in the groove structure 40 to ensure the stability of the second flexible support plate 20 in the groove structure 40.

In some embodiments, the first adhesive layer 50 may be a foam adhesive layer or an optical adhesive layer.

In some embodiments, a thickness of the second flexible support plate 20 is less than a thickness of the first flexible support plate 10, and in the case that the first adhesive layer and the second flexible support plate 20 are simultaneously disposed in the groove structure 40, a surface, distal from the third flexible support plate 30, of the second flexible support plate 20 is flush with a surface, distal from the third flexible support plate 30, of the first flexible support plate 10.

In some embodiments, in the case that the flexible support does not include the third flexible support plate 30, the thickness of the second flexible support plate 20 may be equal to the thickness of the first flexible support plate 10.

In some embodiments, a thickness of the flexible support ranges from 80 μm and 150 μm. That is, a sum of a thickness of the third flexible support plate 30, a thickness of the first adhesive layer 50, and the thickness of the second flexible support plate 20 is the sum of the thickness of the third flexible support plate 30 and the thickness of the first flexible support plate 10.

In some embodiments, the thickness of the first flexible support plate 10 ranges from 30 μm and 120 μm.

In some embodiments, the thickness of the third flexible support plate 30 ranges from 30 μm and 120 μm.

In some embodiments, the thickness of the first adhesive layer 50 ranges from 15 μm and 25 μm.

In some embodiments, the thickness of the second flexible support plate 20 ranges from 20 μm and 100 μm.

The flexible support shown in FIGS. 3, 4, 7, 8, and 12 may be configured to support a foldable display panel that is a flat screen after unfolding, and the flexible support according to the embodiments may further be configured to support a foldable display panel that is a waterfall screen upon unfolding.

Figure 13:
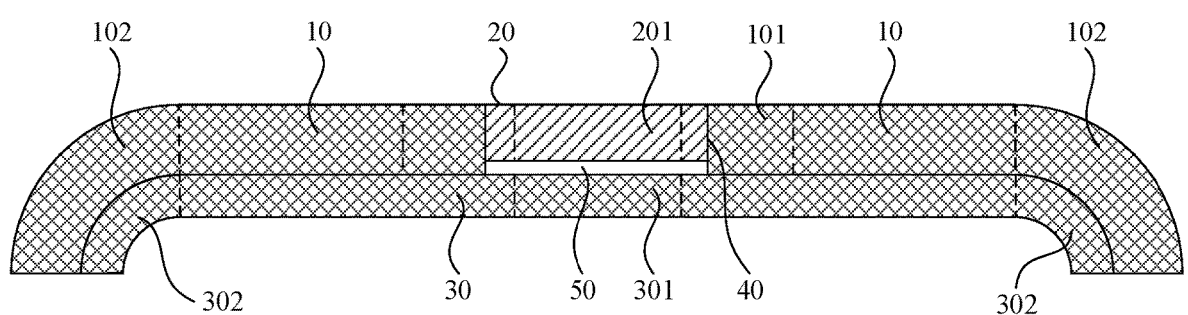
FIG. 13 is a side view of another flexible support according to an embodiment of the present disclosure.

FIG. 13 is a side view of another flexible support according to an embodiment of the present disclosure. Referring to FIG. 13, a side, distal from the second flexible support plate 20, of the first flexible support plate 10 is provided with a first bending structure 102.

In some embodiments, a side, distal from the second flexible support plate 20, of the first flexible support plate 10 is provided with a first bending structure 102, which facilitates the flexible support supporting the waterfall screen of the foldable display panel.

As shown in FIG. 13, the third flexible support plate 30 is provided with a second bending structure 302, and the second bending structure 302 and the first bending structure 102 are opposite to each other.

As shown in FIG. 13, both side edges, distal from the second flexible support plate 20, of the first flexible support plate 10 are provided with the first bending structure 102.

Figure 14:
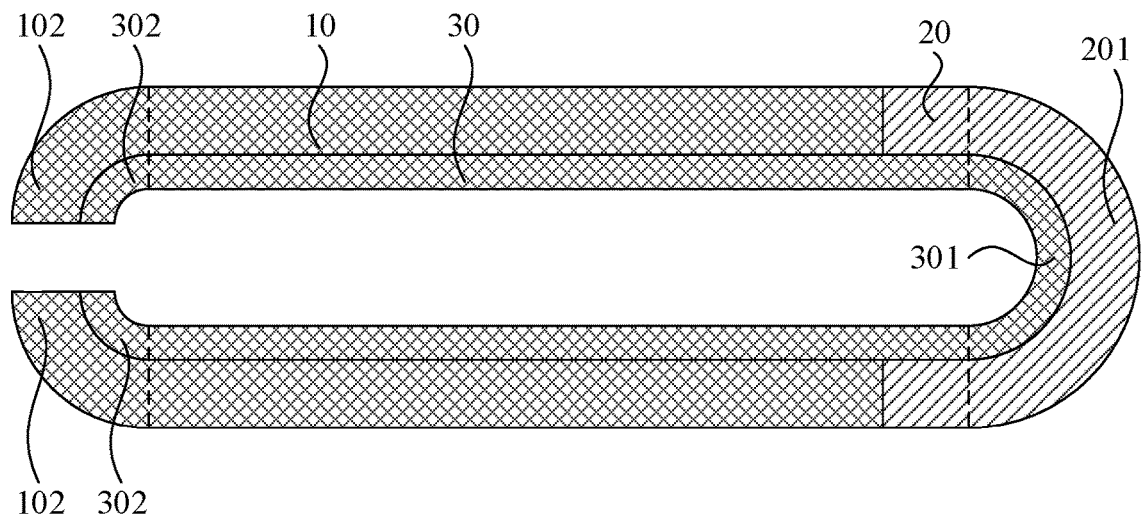
FIG. 14 is a side view of the flexible support in FIG. 13 when bending.

FIG. 14 is a side view of the flexible support in FIG. 13 when bending. Referring to FIG. 14, in the case that the flexible support is bent, two side edges, distal from the second flexible support plate 20, of the first bending structure 102 are opposite to each other, and two side edges, distal from the second flexible support plate 20, of the second bending structure 302 are opposite to each other.

For example, in the case that the flexible support is fully unfolded, the two side edges, distal from the second flexible support plate 20, of the first bending structure 102 are on a same surface. In the case that the flexible support is bent, the two side edges, distal from the second flexible support plate 20, of the first bending structure 102 are parallel to each other, and the two side edges, distal from the second flexible support plate 20, of the second bending structure 302 are parallel to each other.

In some embodiments, in the case the flexible support is bent, the two side edges, distal from the second flexible support plate 20, of the first bending structure 102 may not be opposite to each other, and the two side edges, distal from the second flexible support plate 20, of the second bending structure 302 may not be opposite to each other.

The flexible support shown in FIG. 13 and FIG. 14 is provided with two first foldable structures 102, and in other embodiments, the flexible support may be merely provided with one first folding structure 102.

Figure 15:
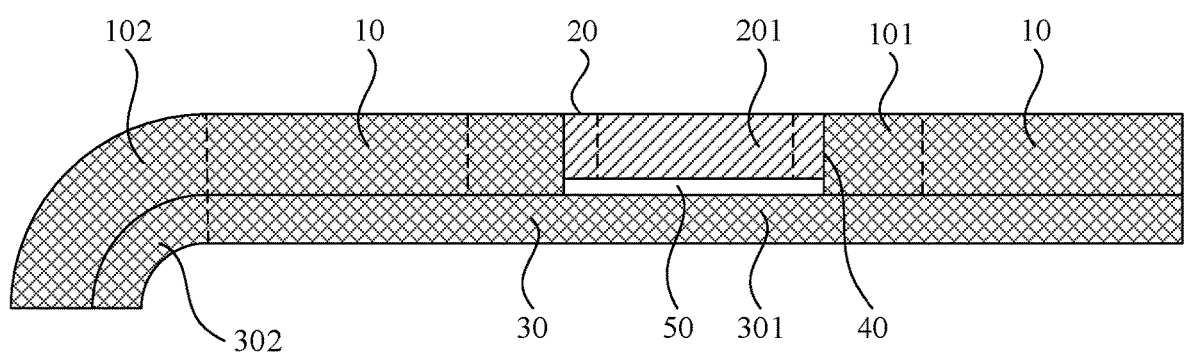
FIG. 15 is a side view of another flexible support according to an embodiment of the present disclosure.

FIG. 15 is a side view of another flexible support according to an embodiment of the present disclosure. Referring to FIG. 15, the first bending structure 102 is merely disposed on one side of the first flexible support plate 10, and the second bending structure 302 is merely disposed on one side of the third flexible support plate 30.

In some embodiments, the surface, distal from the third flexible support plate 30, of the first flexible support plate 10 is provided with a hardened layer.

In some embodiments, the surface, distal from the third flexible support plate 30, of the first flexible support plate 10 is provided with the hardened layer to ensure support of the first flexible support plate 10.

In some embodiments, a surface, distal from the first flexible support plate 10, of the third flexible support plate 30 is further provided with the hardened layer to ensure support of the third flexible support plate 30.

In some embodiments, the resin may be coated on the surface, distal from the first flexible support plate 10, of the third flexible support plate 30 and the surface, distal from the third flexible support plate 30, of the first flexible support plate 10, and then the ultraviolet light is irradiated to the surface of the third flexible support plate 30 and the surface of the first flexible support plate 10, such that the resin on the surface of the third flexible support plate 30 and the surface of the first flexible support plate 10 is harden to form the hardened layer.

Figure 16:
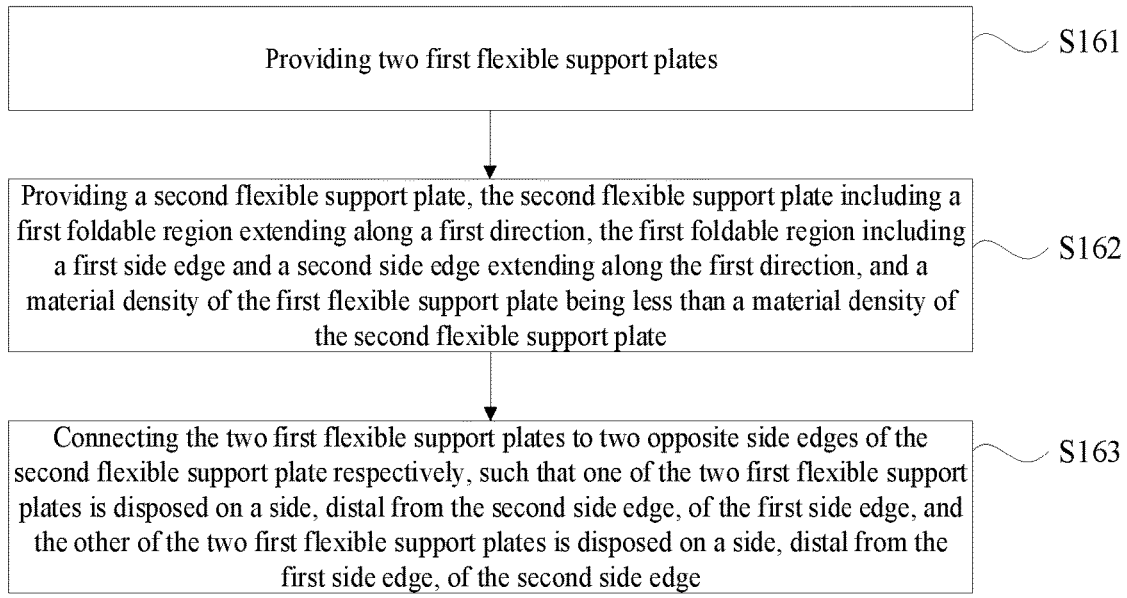
FIG. 16 is a flowchart of a method for manufacturing a flexible support according to an embodiment of the present disclosure.

An embodiment of the present disclosure further provides a method for manufacturing a flexible support. FIG. 16 is a flowchart of a method for manufacturing a flexible support according to an embodiment of the present disclosure. Referring to FIG. 16, the method includes the following processes.

In S161, two first flexible support plates are provided.

In S162, a second flexible support plate is provided. The second flexible support plate includes a first foldable region extending along a first direction. The first foldable region includes a first side edge and a second side edge extending along the first direction. A material density of the first flexible support plate is less than a material density of the second flexible support plate.

In S163, the two first flexible support plates are connected to two opposite side edges of the second flexible support plate respectively, such that one of the two first flexible support plates is disposed on a side, distal from the second side edge, of the first side edge, and the other of the two first flexible support plates is disposed on a side, distal from the first side edge, of the second side edge.

Herein, the structure of the first flexible support plate is the same as the structure of the first flexible support plate shown in FIGS. 3 to 5, 7, 8, and 10 to 15, and the structure of the second flexible support plate is the same as the structure of the second flexible support plate shown in FIGS. 3, 4, 6 to 9, and 12 to 15, which are not repeated herein.

Figure 17:
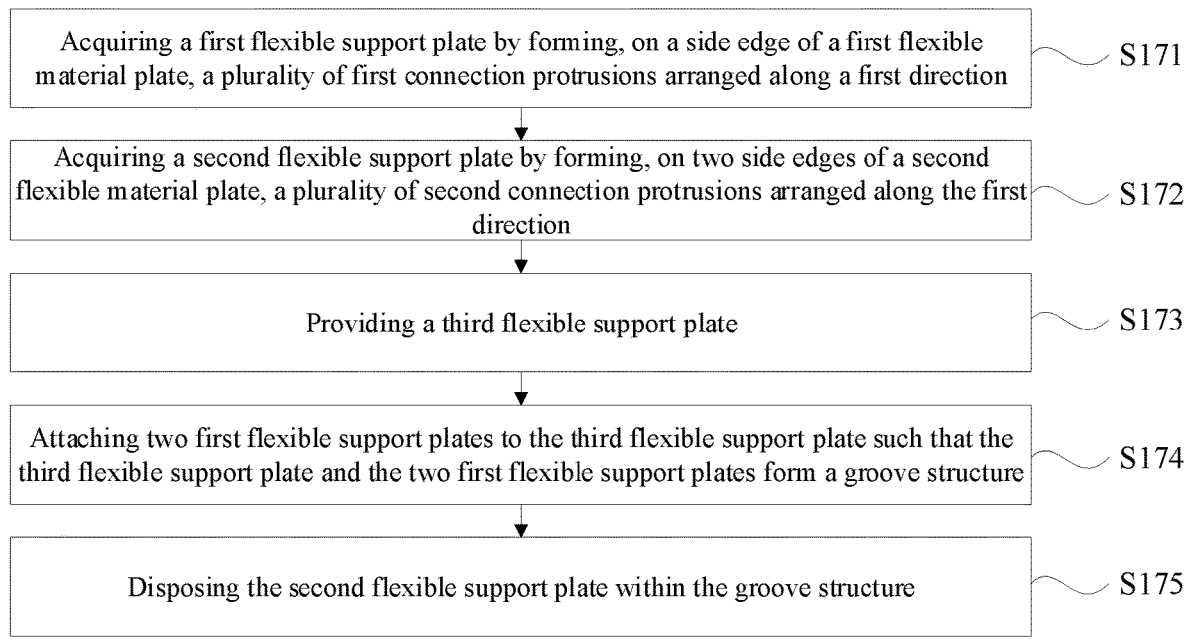
FIG. 17 is a flowchart of a method for manufacturing a flexible support according to an embodiment of the present disclosure.

FIG. 17 is a flowchart of a method for manufacturing a flexible support according to an embodiment of the present disclosure. Referring to FIG. 17, the method includes the following processes.

In S171, a first flexible support plate is acquired by forming, on a side edge of a first flexible material plate, a plurality of first connection protrusions arranged along a first direction.

In some embodiments, the plurality of first connection protrusions arranged along the first direction may be formed on the side edge of the first flexible material plate by laser cutting, such that a first gap is present between any adjacent two of the plurality of first connection protrusions, wherein a maximum width of the first connection protrusion is greater than a width of an end, distal from the second flexible support plate, of the first connection protrusion.

In S172, a second flexible support plate is acquired by forming, on two side edges of a second flexible material plate, a plurality of second connection protrusions arranged along the first direction.

In some embodiments, the plurality of second connection protrusions arranged along the first direction may be formed on two side edges of the second flexible material plate by etching respectively, such that a second gap is present between any adjacent two of the plurality of second connection protrusions. A shape of the second connection protrusion matches a shape of the first gap, and the second connection protrusion and the first gap are in one-to-one correspondence. A shape of the second gap matches a shape of the first connection protrusion, and the second gap and the first connection protrusion are in one-to-one correspondence.

In S173, a third flexible support plate is provided.

In S174, two first flexible support plates are attached to the third flexible support plate, such that the third flexible support plate and the two first flexible support plates form a grooved structure.

In some embodiments, the two first flexible support plates may be attached to the third flexible support plate by a foam adhesive.

In S175, the second flexible support plate is disposed within the groove structure.

In some embodiments, the second flexible support plate may be disposed within the groove structure by the foam adhesive.

Figure 18:
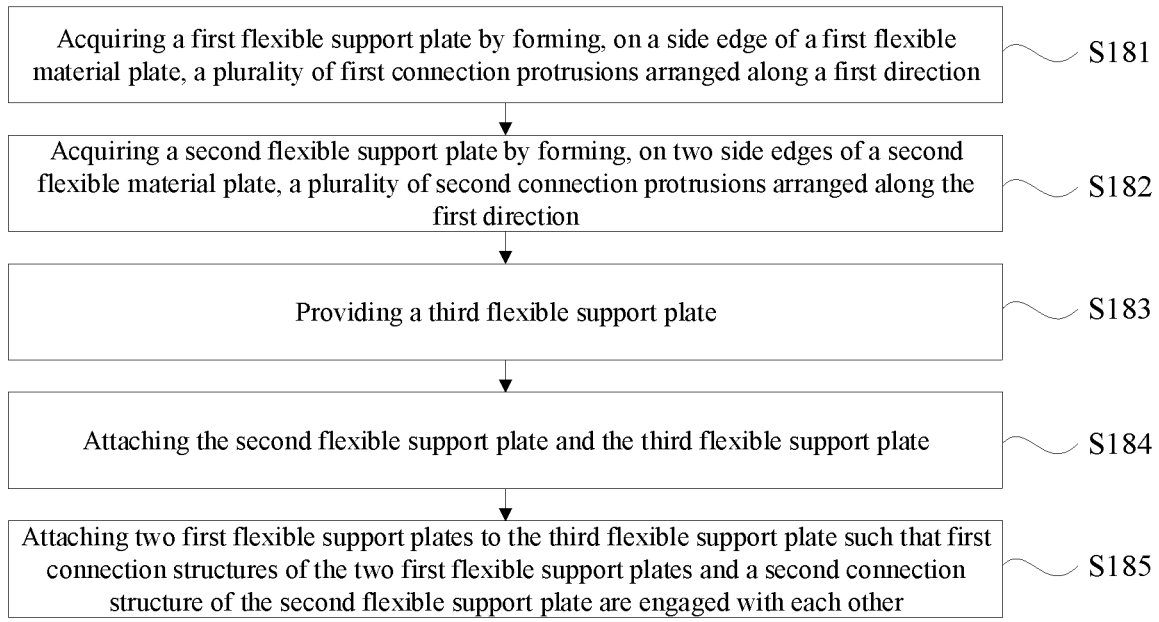
FIG. 18 is a flowchart of a method for manufacturing another flexible support according to an embodiment of the present disclosure.

In some embodiments, processes S174 and S175 may be exchanged. FIG. 18 is a flowchart of a method for manufacturing another flexible support according to an embodiment of the present disclosure. Referring to FIG. 18, the method includes the following processes.

In S181, a first flexible support plate is acquired by forming, on a side edge of a first flexible material plate, a plurality of first connection protrusions arranged along a first direction.

In S182, a second flexible support plate is acquired by forming, on both side edges of a second flexible material plate, a plurality of second connection protrusions arranged along the first direction.

In S183, a third flexible support plate is provided.

In S184, the second flexible support plate and the third flexible support plate are attached.

In some embodiments, the second flexible support plate and the third flexible support plate may be attached by the foam adhesive, and the first foldable region corresponds to a second foldable region.

In S185, both first flexible support plates are attached to the third flexible support plate such that first connection structures of the two first flexible support plates and a second connection structure of the second flexible support plate are engaged with each other.

Figure 19:
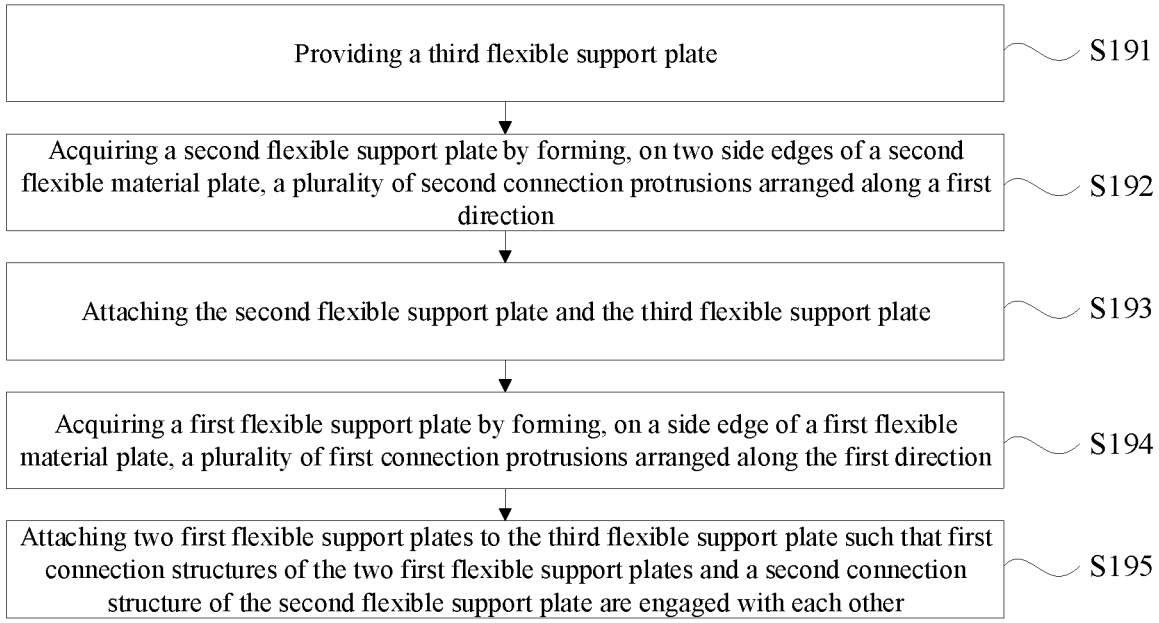
FIG. 19 is a flowchart of a method for manufacturing another flexible support according to an embodiment of the present disclosure.

FIG. 19 is a flowchart of a method for manufacturing another flexible support according to an embodiment of the present disclosure. Referring to FIG. 18, the method includes the following processes.

In S191, a third flexible support plate is provided.

In S192, a second flexible support plate is acquired by forming, on both side edges of a second flexible material plate, a plurality of second connection protrusions arranged along a first direction.

In S193, the second flexible support plate and the third flexible support plate are attached.

In S194, a first flexible support plate is acquired by forming, on a side edge of a first flexible material plate, a plurality of first connection protrusions arranged along the first direction.

In S195, two first flexible support plates are attached to the third flexible support plate such that first connection structures of the two first flexible support plates and a second connection structure of the second flexible support plate are engaged with each other.

Figure 20:
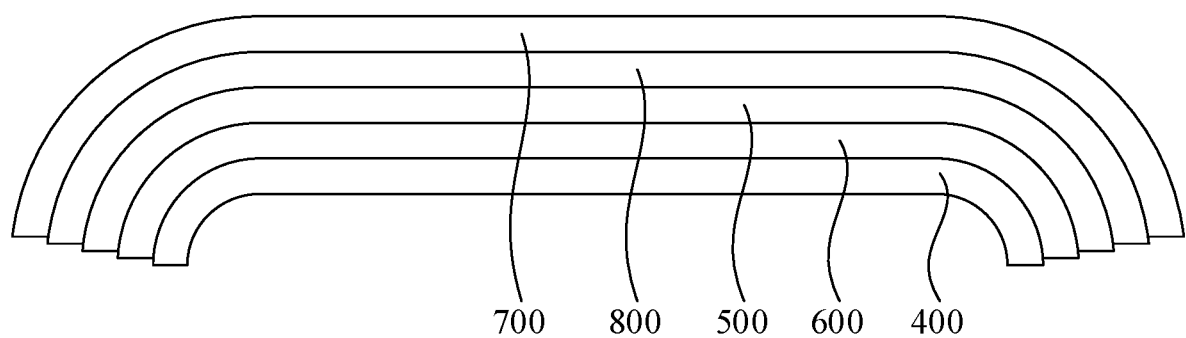
FIG. 20 is a cross-sectional view of a display device according to an embodiment of the present disclosure.

The embodiments of the present disclosure further provide a display device, FIG. 20 is a cross-sectional view of a display device according to an embodiment of the present disclosure. Referring to FIG. 20, the display device includes a flexible support 400 and a foldable display panel 500 that are laminated, wherein the flexible support is the flexible support shown in any of FIGS. 3, 4, 7, 8, and 12 to 15.

The display device according to the embodiments may be a liquid crystal display device, an organic light emitting diode display device, a quantum dot display device, and the like. In the specific implementations, the display device according to the embodiments may be any product or component with a display function, such as a cell phone, a tablet computer, a television, a display, a laptop computer, a digital photo frame, or a navigator.

Referring to FIG. 20, the flexible support 400 and the foldable display panel 500 are bonded together by a first adhesive layer 600.

For example, the first adhesive layer 600 may be a foam adhesive layer.

Referring to FIG. 20, the display device further includes a cover plate 700, and the cover plate 700 is bonded with the foldable display panel 500 by a second adhesive layer 800.

For example, the second adhesive layer 800 may be an optical adhesive layer.

For example, the cover plate 700 is a flexible cover plate to ensure the foldable performance of the display device.

Referring to FIG. 20, in the case that the flexible support is applied to a waterfall screen, the boundaries of the flexible support 400, the first adhesive layer 600, the foldable display panel 500, the second adhesive layer 800, and the cover plate 700 may not be flush.

Described above are merely exemplary embodiments of the present disclosure and are not intended to limit the disclosure. It should be noted that any modification, equivalent replacement, improvement, and the like made within the spirit and principle of the embodiments of the present disclosure should be included in the protection scope of the present disclosure.

What is claimed is:

1. A flexible support, wherein the flexible support is configured to support a foldable display panel, and the flexible support comprises two first flexible support plates and one second flexible support plate; wherein
the second flexible support plate comprises a first foldable region extending along a first direction, wherein the first foldable region comprises a first side edge and a second side edge extending along the first direction;
one of the two first flexible support plates is disposed on a side, distal from the second side edge, of the first side edge, the other of the two first flexible support plates is disposed on a side, distal from the first side edge, of the second side edge, and the two first flexible support plates are respectively connected to two opposite side edges of the second flexible support plate; and
a material density of the first flexible support plate is less than a material density of the second flexible support plate,
wherein a side edge, connected to the second flexible support plate, of the first flexible support plate is provided with a first connection structure, and the two opposite side edges, connected to the first flexible support plate, of the second flexible support plate are each provided with a second connection structure, wherein the first connection structure and the second connection structure are engaged with each other;
the first connection structure comprises a plurality of first connection protrusions arranged along the first direction, wherein a first gap is present between any adjacent two of the plurality of first connection protrusions, and a maximum width of the first connection protrusion is greater than a width of an end, distal from the second flexible support plate, of the first connection protrusion;
the second connection structure comprises a plurality of second connection protrusions arranged along the first direction, wherein a second gap is present between any adjacent two of the plurality of second connection protrusions;
a shape of the second connection protrusion matches a shape of the first gap, and the second connection protrusion and the first gap are in one-to-one correspondence; a shape of the second gap matches a shape of the first connection protrusion, and the second gap and the first connection protrusion are in one-to-one correspondence; and the second connection protrusion is disposed within a corresponding first gap, and the first connection protrusion is disposed within a corresponding second gap, and
the shape of the first connection protrusion and the shape of the second connection protrusion are both drops.

2. The flexible support according to claim 1, wherein
a ratio of the width to the maximum width ranges from ⅓ to ½; and
a ratio of the maximum width to a length of the first connection protrusion ranges from 3/10 to ½.

3. The flexible support according to claim 1, wherein the second flexible support plate further comprises a foldable plate and a connection plate; wherein
the first foldable region is disposed on the foldable plate; and
the connection plate is connected to the foldable plate and the second connection structure, and a ratio of a width of the connection plate to a length of the second connection protrusion ranges from ⅕ to ⅓.

4. The flexible support according to claim 1, wherein the flexible support further comprises a third flexible support plate; wherein
the two first flexible support plates are laminated on the third flexible support plate, the third flexible support plate and the two first flexible support plates form a groove structure, and the second flexible support plate is disposed within the groove structure.

5. The flexible support according to claim 4, wherein the flexible support further comprises: a first adhesive layer disposed between the third flexible support plate and the second flexible support plate.

6. The flexible support according to claim 1, wherein a surface, opposite to the foldable display panel, of the first flexible support plate is provided with a hardened layer.

7. The flexible support according to claim 1, wherein a side, distal from the second flexible support plate, of at least one of the first flexible support plates is provided with a first bending structure.

8. The flexible support according to claim 7, wherein in response to the flexible support being bent, two side edges, distal from the second flexible support plate, of the first bending structure are opposite to each other.

9. The flexible support according to claim 1, wherein
the first flexible support plate is made of at least one of polymer clay, polyester resin, polyimide, flexible polyurethane; and
the second flexible support plate is made of at least one of stainless steel, aluminum alloy, and titanium alloy.

10. The flexible support according to claim 1, wherein the second flexible support plate comprises a hollow in the first foldable region.

11. The flexible support according to claim 10, wherein the hollow is a waist-shaped hole.

12. The flexible support according to claim 1, wherein in response to the maximum width of the first connection protrusion being greater than the width of the end, distal from the second flexible support plate, of the first connection protrusion, a pulling force present between the first connection protrusion and the second connection protrusion in a folding process of the flexible support is insufficient to separate the first flexible support plate from the second flexible support plate, and the first connection structure and the second connection structure are still engaged with each other.

13. A method for manufacturing a flexible support, comprising:
providing two first flexible support plates;
providing a second flexible support plate, wherein the second flexible support plate comprises a first foldable region extending along a first direction, the first foldable region comprising a first side edge and a second side edge extending along the first direction, a material density of the first flexible support plate being less than a material density of the second flexible support plate;
connecting the two first flexible support plates to two opposite side edges of the second flexible support plate respectively, such that one of the two first flexible support plates is disposed on a side, distal from the second side edge, of the first side edge, and the other of the two first flexible support plates is disposed on a side, distal from the first side edge, of the second side edge,
wherein a side edge, connected to the second flexible support plate, of the first flexible support plate is provided with a first connection structure, and the two opposite side edges, connected to the first flexible support plate, of the second flexible support plate are each provided with a second connection structure, wherein the first connection structure and the second connection structure are engaged with each other;
the first connection structure comprises a plurality of first connection protrusions arranged along the first direction, wherein a first gap is present between any adjacent two of the plurality of first connection protrusions, and a maximum width of the first connection protrusion is greater than a width of an end, distal from the second flexible support plate, of the first connection protrusion;
the second connection structure comprises a plurality of second connection protrusions arranged along the first direction, wherein a second gap is present between any adjacent two of the plurality of second connection protrusions;
a shape of the second connection protrusion matches a shape of the first gap, and the second connection protrusion and the first gap are in one-to-one correspondence; a shape of the second gap matches a shape of the first connection protrusion, and the second gap and the first connection protrusion are in one-to-one correspondence; and the second connection protrusion is disposed within a corresponding first gap, and the first connection protrusion is disposed within a corresponding second gap, and
the shape of the first connection protrusion and the shape of the second connection protrusion are both drops.

14. The method according to claim 13, further comprising:
providing a third flexible support plate;
attaching the two first flexible support plates to the third flexible support plate such that the third flexible support plate and the two first flexible support plates form a groove structure; and
disposing the second flexible support plate within the groove structure.

15. A display device, comprising: a flexible support and a foldable display panel that are laminated; wherein the flexible support comprises two first flexible support plates and one second flexible support plate; wherein
the second flexible support plate comprises a first foldable region extending along a first direction, the first foldable region comprising a first side edge and a second side edge extending along the first direction; and one of the two first flexible support plates is disposed on a side, distal from the second side edge, of the first side edge, the other of the two first flexible support plates is disposed on a side, distal from the first side edge, of the second side edge; wherein the two first flexible support plates are respectively connected to both side edges of the second flexible support plate; and
a material density of the first flexible support plate is less than a material density of the second flexible support plate,
wherein a side edge, connected to the second flexible support plate, of the first flexible support plate is provided with a first connection structure, and the two opposite side edges, connected to the first flexible support plate, of the second flexible support plate are each provided with a second connection structure, wherein the first connection structure and the second connection structure are engaged with each other;
the first connection structure comprises a plurality of first connection protrusions arranged along the first direction, wherein a first gap is present between any adjacent two of the plurality of first connection protrusions, and a maximum width of the first connection protrusion is greater than a width of an end, distal from the second flexible support plate, of the first connection protrusion;
the second connection structure comprises a plurality of second connection protrusions arranged along the first direction, wherein a second gap is present between any adjacent two of the plurality of second connection protrusions;
a shape of the second connection protrusion matches a shape of the first gap, and the second connection protrusion and the first gap are in one-to-one correspondence; a shape of the second gap matches a shape of the first connection protrusion, and the second gap and the first connection protrusion are in one-to-one correspondence; and the second connection protrusion is disposed within a corresponding first gap, and the first connection protrusion is disposed within a corresponding second gap, and
the shape of the first connection protrusion and the shape of the second connection protrusion are both drops.

16. The display device according to claim 15, wherein
a ratio of the width to the maximum width ranges from $1/3$ to $1/2$; and
a ratio of the maximum width to a length of the first connection protrusion ranges from $3/10$ to $1/2$.

* * * * *